US010526722B2

(12) United States Patent
Nakabayashi et al.

(10) Patent No.: US 10,526,722 B2
(45) Date of Patent: Jan. 7, 2020

(54) METHOD FOR MANUFACTURING SILICON CARBIDE SINGLE CRYSTAL

(71) Applicant: SHOWA DENKO K.K., Tokyo (JP)

(72) Inventors: Masashi Nakabayashi, Tokyo (JP); Kiyoshi Kojima, Osato-Gun (JP); Hiroyuki Deai, Osato-Gun (JP); Kota Shimomura, Osato-Gun (JP); Yukio Nagahata, Osato-Gun (JP)

(73) Assignee: SHOWA DENKO K.K., Tokyo (JP)

( * ) Notice: Subject to any disclaimer, the term of this patent is extended or adjusted under 35 U.S.C. 154(b) by 161 days.

(21) Appl. No.: 15/560,978

(22) PCT Filed: Mar. 18, 2016

(86) PCT No.: PCT/JP2016/058854
§ 371 (c)(1),
(2) Date: Sep. 22, 2017

(87) PCT Pub. No.: WO2016/152813
PCT Pub. Date: Sep. 29, 2016

(65) Prior Publication Data
US 2018/0251909 A1    Sep. 6, 2018

(30) Foreign Application Priority Data

Mar. 24, 2015 (JP) ................................. 2015-060828

(51) Int. Cl.
C30B 23/02        (2006.01)
C30B 23/00        (2006.01)
(Continued)

(52) U.S. Cl.
CPC ............ C30B 23/002 (2013.01); C30B 29/36 (2013.01); H01L 21/02529 (2013.01)

(58) Field of Classification Search
CPC ........ C30B 23/002; C30B 23/02; C30B 29/36
See application file for complete search history.

(56) References Cited

U.S. PATENT DOCUMENTS

2013/0056755 A1* 3/2013 Hatai ................ H01L 23/49805
                                                              257/77
2015/0003124 A1* 1/2015 Sakai ..................... H02M 1/12
                                                              363/37

FOREIGN PATENT DOCUMENTS

JP        2000-203982 A     7/2000
JP        2008-74663 A      4/2008
(Continued)

OTHER PUBLICATIONS

Burk et al., "SiC Epitaxial Layer Growth in a 6×150 mm Warm-Wall Planetary Reactor," Materials Science Forum, vols. 717-720, Online: May 14, 2012, pp. 75-80.
(Continued)

Primary Examiner — Robert M Kunemund
(74) Attorney, Agent, or Firm — Birch, Stewart, Kolasch & Birch, LLP

(57) ABSTRACT

The present invention provides a method of manufacturing by the sublimation-recrystallization method more accurately detecting a thermal state of a starting material in a crucible and enabling control of the growth conditions while manufacturing an SiC single crystal. The method obtains the high frequency current to be supplied through the induction coil by a converter for converting AC current to DC current and an inverter means for converting the DC current output from the converter to a high frequency to obtain a high frequency current, obtains a grasp, in advance, of a relationship between a variation over time of a DC equivalent resistivity (DCV/DCI), calculated from a DC voltage value (DCV) and DC current value (DCI) converted by the converter at the time of growth of the silicon carbide single crystal, and a density of micropipes formed in the grown silicon carbide single crystal, and adjusts at least one of the DCV or DCI at
(Continued)

the converter based on the relationship of the DC equivalent resistivity and micropipe density grasped in advance.

3 Claims, 5 Drawing Sheets

(51) Int. Cl.
*C30B 29/36* (2006.01)
*H01L 21/02* (2006.01)

(56) References Cited

FOREIGN PATENT DOCUMENTS

| JP | 2009-227525 A | 10/2009 |
|---|---|---|
| JP | 2009-292723 A | 12/2009 |
| JP | 2013-126931 A | 6/2013 |
| JP | 2014-108915 A | 6/2014 |
| KR | 10-1258052 B1 | 4/2013 |

OTHER PUBLICATIONS

Drachev et al., "Fundamental Limitations of SiC PVT Growth Reactors with Cylindrical Heaters," Materials Science Forum, vols. 527-529, Online: Oct. 15, 2006, pp. 15-20.
International Search Report (form PCT/ISA/210), dated Jun. 14, 2016, for corresponding International Application No. PCT/JP2016/058854; with English translation.
Kusunoki et al., "Top-seeded Solution Growth of 3 Inch Diameter 4H—SiC Bulk Crystal Using Metal Solvents," Materials Science Forum, vols. 778-780, Online: Feb. 26, 2014, pp. 79-82.
Tairov et al., "General Principles of Growing Large-size Single Crystals of Various Silicon Carbide Polytypes," Journal of Crystal Growth, vol. 52, 1981, pp. 146-150.

* cited by examiner

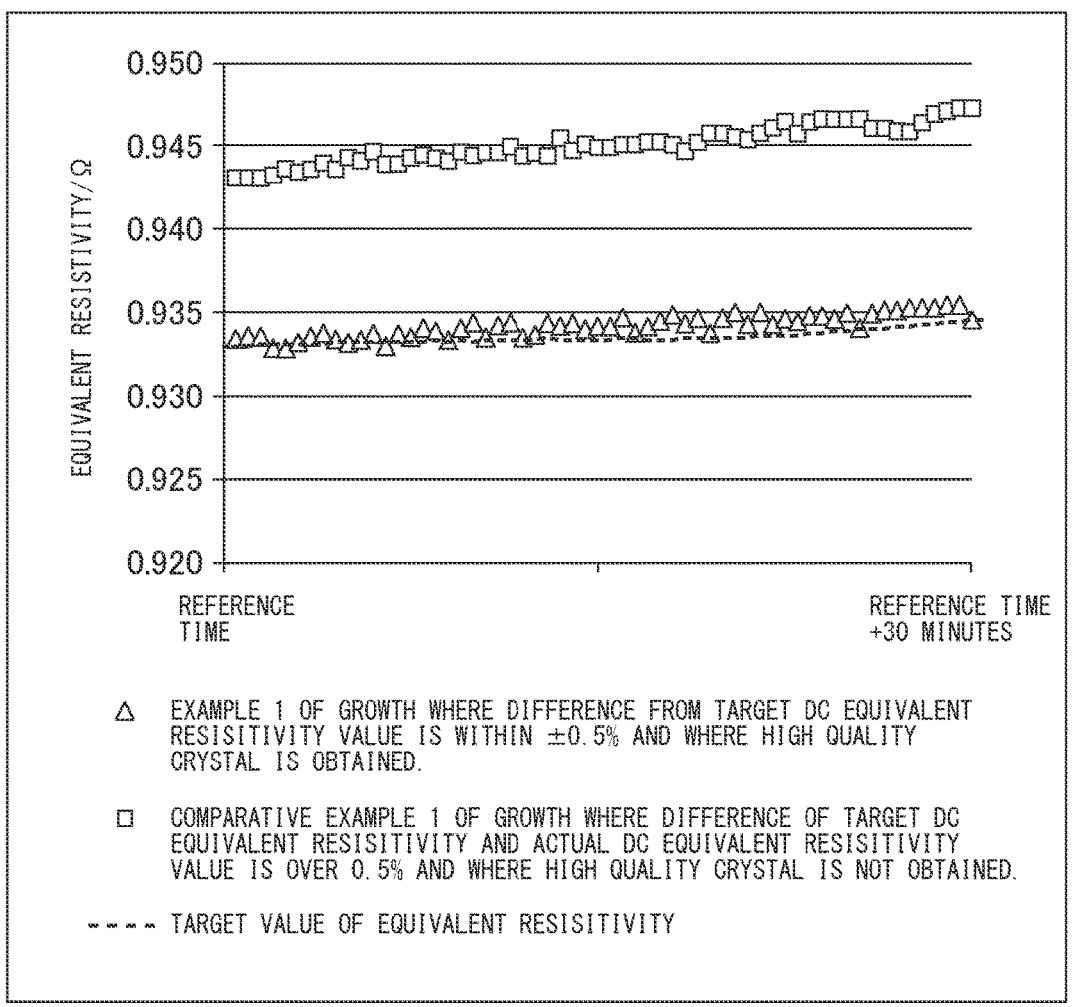

METHOD FOR MANUFACTURING SILICON CARBIDE SINGLE CRYSTAL

TECHNICAL FIELD

The present invention relates to a method for manufacturing a silicon carbide single crystal.

BACKGROUND ART

SiC (silicon carbide) is a wide bandgap semiconductor having a wide bandgap of 2.2 to 3.3 eV. Due to its excellent physical and chemical properties, it has been a focus of R&D as a device material since the 1960s. In particular, in recent years, SiC has been looked at closely as a material for blue to ultraviolet short wavelength light devices, high frequency electronic devices, and high-voltage and high-power electronic devices. In this regard, SiC is considered difficult to manufacture as a high quality large-sized single crystal. This has been one of the major factors obstructing the commercial application of SiC devices.

In the past, on a laboratory scale, for example, an SiC single crystal of a size enabling the fabrication of semiconductor devices had been obtained by the sublimation-recrystallization method (Rayleigh method). However, with this method, the obtained single crystal is small in area. Control of the dimensions, shape, and polytype and of the impurity carrier concentration is also not easy. On the other hand, chemical vapor deposition (CVD) is also being used to cause heteroepitaxial growth on silicon (Si) and other different substrates so as to grow cubic SiC single crystals. With this method, a large area single crystal is obtained, but there is also an approximately 20% lattice mismatch of SiC and Si etc., so it is only possible to grow an SiC single crystal with a large number of defects (up to $10^7/cm^2$). A high quality SiC single crystal could not be obtained.

Therefore, to solve these problems, the sublimation-recrystallization method using an SiC single crystal wafer as a seed crystal for sublimation-recrystallization has been proposed (see NPLT 1). If using this improved type sublimation-recrystallization method (modified Rayleigh method), it is possible to control the polytype of the SiC single crystal (6H type, 4H type, 15R type, etc.), shape, carrier type and concentration while growing the SiC single crystal. In addition, SiC comes in 200 or more polytypes, but from the viewpoint of the productivity of the crystal and the performance of the electronic device, 4H polytype is considered the most superior. Most commercially produced SiC single crystals are 4H type. Further, regarding the conductivity, as the dopant, nitrogen is easy to handle. On this point, single crystal ingots are almost always grown by n-type conductivity. However, in applications for communication devices, crystals which contain almost no dopant elements and are high in resistivity are also being manufactured.

At the present time, diameter of 51 mm (2 inch) to 100 mm SiC single crystal wafers are being cut out from SiC single crystals fabricated by the sublimation-recrystallization method and are being used for fabrication of devices in the electrical power and electronics fields etc. Furthermore, 150 mm wafers are also starting to be marketed (see NPLT 2). Full scale commercialization of devices using 100 mm or 150 mm wafers is anticipated. In view of this situation, the technologies for improving the productivity of SiC ingots and the yield of crystal growth and thus leading to a drop in costs have become to be increasingly important.

The main method for manufacturing a SiC single crystal ingot is, as explained above, the modified Rayleigh method. Solution growth (see NPLT 3), high temperature CVD (see NPLT 4), etc. are also being performed at the research level, but these do not approach the modified Rayleigh method in terms of productivity (number of wafers able to be obtained per ingot or success rate of growth of high quality ingots) and quality. However, the modified Rayleigh method is a process performed at a ultra-high temperature of 2000° C. or more. Further, since the material is supplied in a vapor phase on growing surface, etc., control of the growth conditions is technically difficult. The precise figures of the different SiC wafer manufacturers have not been disclosed publicly, but the number of wafers able to be obtained per ingot and the success rate of growth of high quality ingots reportedly do not approach those of the Si and other highly technically advanced industries. From the viewpoint of pursuit of commercial profit, further improvement is sought in the productivity of SiC single crystals.

For the above purpose, conditions for manufacturing a SiC single crystal ingot by the sublimation-recrystallization method are the focus of intense R&D. These mostly relate to the material and structure of the crucible forming the growth vessel, the purity and particle size of the starting material, and the ingredients and type of the atmospheric gas, but the temperature of the starting material or growth surface can be said to be the most important factor in the success rate or the yield of the crystal growth. The reason why is that, in growth of a single crystal, not limited to SiC, the temperature directly impacts the conditions of both the sublimation or melting of the starting material and the solidification or recrystallization of the single crystal. In SiC single crystal growth as well, only naturally, an emission pyrometer or other general method was used to measure the temperature of the crucible.

PLT 1 discloses a silicon carbide single crystal ingot with a seed crystal obtained by growing a silicon carbide single crystal by a method for manufacturing a silicon carbide single crystal including a step of using the sublimation-recrystallization method using a seed crystal for silicon carbide single crystal growth having a groove of a width of 0.7 mm to less than 2 mm at its growth face so as to grow a silicon carbide single crystal on the seed crystal. The seed crystal is placed inside the crucible together with the SiC starting material powder and is heated in an argon or other inert gas atmosphere to 2000 to 2400° C. The temperature gradient is set so that the seed crystal becomes somewhat lower in temperature compared with the starting material powder.

However, SiC single crystal growth is ultra-high temperature (2000° C. to 2600° C., see NPLT 4) and vapor phase growth process, so the growth crucible is semisealed in structure. The temperatures of the starting material and grown crystal are difficult to directly measure.

Further, in the high temperature SiC sublimation-recrystallization method, the general practice is to use an induction heating furnace surrounding the crucible with an induction coil. Due to the characteristics of induction heating, the position where the sublimation reaction occurs is near the side walls of the crucible in which the starting material is held, so direct measurement of the starting material temperature is not possible. For this reason, the temperature measurement point used for estimating the temperature has to be made the bottom surface of the crucible far from the position where the sublimation reaction occurs. In PLT 1 as well, the starting material temperature is estimated from the temperature of the bottom surface of the crucible.

CITATIONS LIST

Patent Literature

PLT 1: Japanese Patent Publication No. 2009-292723A
PLT 2: Japanese Patent Publication No. 2000-203982A Nonpatent Literature NPLT 1: Yu. M. Tairov and V. F. Tsvetkov, *Journal of Crystal Growth*, vols. 52 (1981), pp. 146-150
NPLT 2: A. A. Burk et al., *Mater. Sci. Forum*, 717-720, (2012), pp. 75-80
NPLT 3: K. Kusunokil et al., *Mater. Sci. Forum*, 778-780, (2014), pp. 79-82
NPLT 4: R. Drachev et al., *Mater. Sci. Forum*, 527-529, (2006), pp. 15-20

SUMMARY OF INVENTION

Technical Problem

As explained above, SiC has problems in productivity and quality since manufacturing a single crystal is difficult. These are obstructing expanded practical application. The serious factor making manufacturing a single crystal difficult is that the sublimation temperature of the starting material contained in the crucible cannot be directly measured. The temperature of the seed crystal positioned at the center axis of the crucible can be estimated relatively precisely by the surface temperature of the crucible measured using an emission pyrometer utilizing an opening provided in the insulating material covering the crucible and serving dually as a heat dissipator.

However, the relationship between the temperature of the seed crystal and the sublimation temperature of the starting material is not uniform due to variations in the material of the crucible etc. To obtain an accurate grasp of the growth conditions, it is necessary to learn the sublimation temperature of the starting material. At this time, due to the characteristics of induction heating, the sublimation reaction occurs preferentially in the vicinity of the outer circumference of the starting material contained in the crucible (vicinity of side walls of crucible), so it is extremely difficult to maintain the balance of the temperature at the circumference while measuring the temperature. Furthermore, the sublimation temperature of the starting material is a ultra-high temperature reaching as high as 2600° C. Basically, even the opening for the emission pyrometer ends up having a great effect on the temperature conditions. That is, in the prior art of measuring the bottom surface of the crucible from the outside by an emission pyrometer, it was not only not possible to measure the sublimation temperature of the starting material, but it was also not possible to obtain a highly reliable physical indicator enabling estimation of the same.

PLT 2 discloses a single crystal growth apparatus using a floating zone melting method of controlling the power input from a high frequency oscillator to an induction coil so as to grow a single crystal and form it into a predetermined shape. This apparatus measures the voltage across coil terminals of the induction coil to accurately derive the power of the induction coil from which various power losses have been eliminated and controls the same to control the actual heating temperature of the starting material polycrystal. However, the current across the terminals of the induction coil is a high frequency current. A phase difference also occurs, so advanced equipment and technology become required for measurement and analysis. Further, the apparatus does not consider the current density or temperature distribution in the heated object, so is not suited to control of SiC single crystal growth.

The present invention was made in consideration of such problems in the prior art and has as its object the provision of a method more accurately detecting the thermal state of a starting material in a crucible to enable the control of the growth conditions by the sublimation-recrystallization method while producing a SiC single crystal.

Solution to Problem

To solve the above problems, the inventors focused on the point that an inductively heated crucible changes in resistivity due to temperature. The graphite generally used as a crucible material for producing an SiC single crystal by the sublimation-recrystallization method falls in resistivity from room temperature to about 1000° C., but at a temperature higher than that, the resistivity rises along with the rise in temperature. Other materials, for example, TaC, able to be used as the crucible material for producing a SiC single crystal also rise in resistivity along with the rise in temperature in the temperature region of single crystal growth. Further, in the case of induction heating, the induction current inside the crucible is not uniformly distributed. Current concentrates at the outermost circumference of the crucible (outer skin). In the axial direction at the inside of the crucible as well, distribution occurs due to the crucible shape and relative position between the crucible and the induction coil. Further, the vicinity of the position of the high current density is the position becoming highest in temperature. The sublimation reaction occurs preferentially in the vicinity of the position of the highest temperature. That is, the change in impedance of the induction circuit can serve as an indicator showing the change of sublimation temperature causing sublimation of the starting material inside the crucible.

However, the induction current of the induction coil at an induction heating furnace is a high frequency of several kHz to tens of kHz and the maximum output sometimes reaches 1000 A, so sophisticated equipment and skill are required for the measurement thereof. Further, between the high frequency current and high frequency voltage, a phase difference occurs according to the characteristics of the equipment and induction heated object, so advanced skill becomes required for analysis of the measured values as well. It is not easy to accurately calculate the impedance. Due to such a background, in the past, in manufacturing an SiC single crystal, the impedance of the induction heating furnace had not been controlled.

Therefore, the inventors engaged in intensive research. We measured the DC current value and DC voltage value at a stage before converting current to a high frequency inside a high frequency power supply for supplying high frequency current to an induction coil, calculated the equivalent resistivity of the DC circuit, and discovered that this DC equivalent resistivity was correlated with the sublimation temperature of the starting material. In addition, we discovered that if using the DC equivalent resistivity where a high quality SiC single crystal ingot is obtained as an indicator and controlling the growth conditions to manufacture an SiC single crystal, it is possible to improve the success rate and yield of crystal growth and thereby completed the present invention.

The present invention includes the following configurations.

(1) A method for manufacturing a silicon carbide single crystal comprising surrounding a crucible holding a starting material powder and a seed crystal by an induction coil, supplying a high frequency current through the induction coil to heat the crucible, and making the starting material powder sublimate to grow a silicon carbide single crystal on the seed crystal, the method comprising: supplying the high frequency current through the induction coil by a converter for converting AC current to DC current and an inverter means for converting the DC current output from the converter to a high frequency current; grasping, in advance, a relationship between variations in a DC equivalent resistivity (DCV/DCI) calculated from a DC voltage value (DCV) and DC current value (DCI) converted by the converter during crystal growth, and a density of micropipes formed in the grown silicon carbide single crystal; and controlling at least one of the DC voltage value (DCV) or DC current value (DCI) at the converter based on the relationship of the variations in the DC equivalent resistivity over time and the density of micropipe.

(2) The method for manufacturing a silicon carbide single crystal according to (1), wherein the micropipe density in the relationship of the DC equivalent resistivity and micropipe density grasped in advance is a predetermined allowable value or less.

(3) The method for manufacturing a silicon carbide single crystal according to (2), wherein the allowable value of the micropipe density is 5/cm$^2$ or less.

Advantageous Effects of Invention

According to the present invention, it is possible to more accurately detect the thermal state of a starting material inside a crucible, which had been difficult in the past, and thereby control the growth conditions by the sublimation-recrystallization method, so it is possible to raise the success rate and yield of crystal growth. Further, it is possible to improve the quality of the obtained SiC single crystal.

BRIEF DESCRIPTION OF DRAWINGS

FIG. 3B A graph showing variations in a target DC equivalent resistivity over time shown in FIG. 3A, variations in a DC equivalent resistivity over time according to a method for manufacturing a silicon carbide single crystal of an invention example, and variations in a DC equivalent resistivity over time according to a method for manufacturing a silicon carbide single crystal of a comparative example.

DESCRIPTION OF EMBODIMENTS

Figure 1:
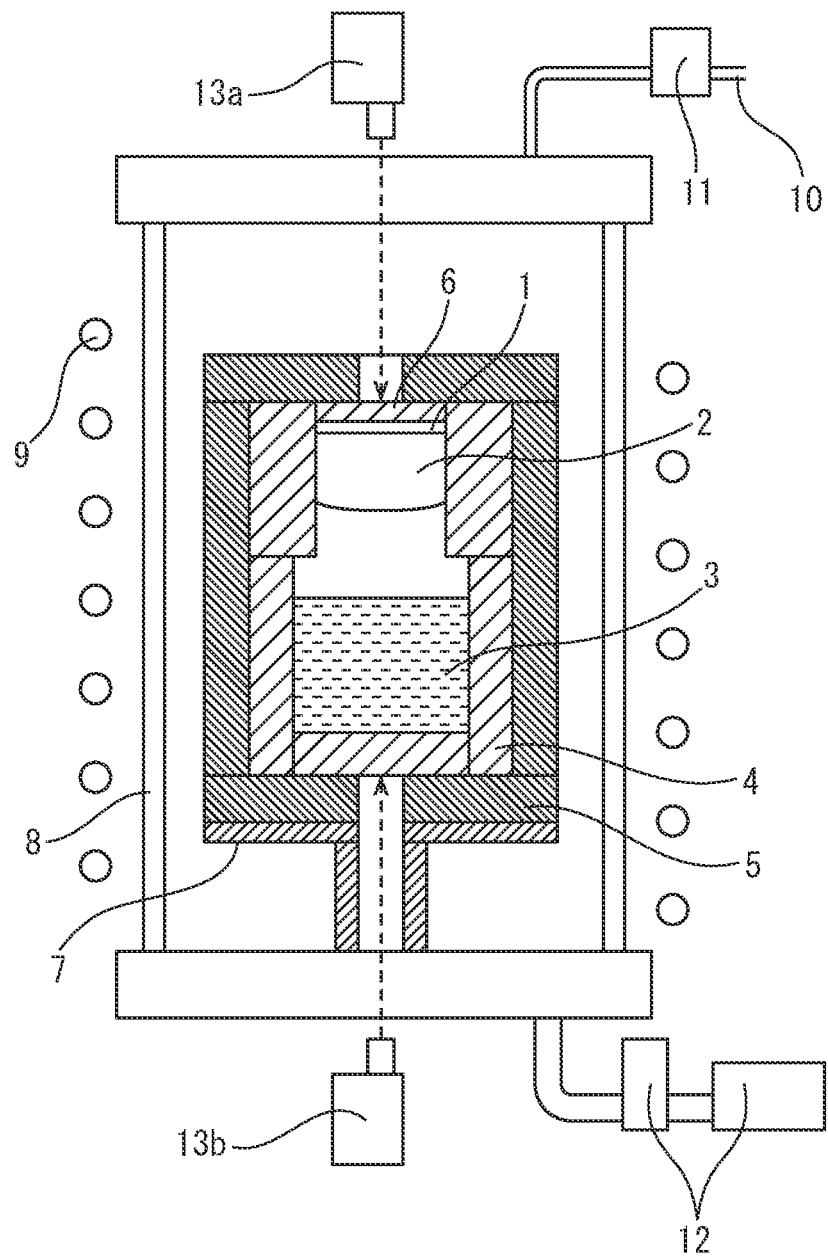
FIG. 1 is a schematic diagram showing a crystal growth apparatus used in the present invention.

Below, the present invention will be explained in detail. In the present invention, an induction heating furnace wherein a crucible containing a starting material powder and seed crystal are surrounded by an induction coil is used. High frequency current is supplied through the induction coil to heat the crucible and make the starting material powder sublimate to thereby grow an SiC single crystal on the seed crystal and obtain an SiC single crystal. Here, the high frequency power supply for supplying a high frequency current through the induction coil is one having a converter for converting AC current to DC current and controlling the output and an inverter means for converting the DC current output from the converter to a high frequency to obtain a high frequency current. That is, the high frequency power supply of the induction heating furnace used in the present invention is configured to use internal converter thereof to convert the primary power source (in general, a three-phase alternating current power supply) to direct current and simultaneously to adjust the output, then use the inverter means to convert this to high frequency power of the desired frequency. The configuration of this power supply is one of a general high frequency power supply. A known one may be used.

As explained above, the inventors discovered that if measuring the DC current value and DC voltage value before converting the current to a high frequency at the inside of the high frequency power supply and calculating the equivalent resistivity of the DC circuit, this DC equivalent resistivity will be correlated with the temperature for causing sublimation of the starting material inside the crucible. Therefore, when using the sublimation-recrystallization method to grow an SiC single crystal, it is possible to measure the DC voltage value (DCV) and DC current value (DCI) output from the converter of the high frequency power supply and calculate the DC equivalent resistivity from the ratio DCV/DCI. In general, when using an induction heating furnace to grow an SiC single crystal by the sublimation-recrystallization method, the DC current value and DC voltage value of the high frequency power supply are respectively values at a maximum of 200 to 500 A and 200 to 500V. For this reason, the DCI and DCV output from the converter can be measured by general methods using commercially available amperemeter, voltmeter and recorder.

In the past, in industrial applications of induction heating such as growing SiC single crystals, the general practice had been to use a high frequency current for controlling the operation of the induction heating apparatus. This is because the high frequency current, which directly determines the magnetic field, can be grasped as an important parameter. On the other hand, the direct current and voltage output from the converter are not the values flowing to the induction coil, so are treated as values close to the primary power source and are not used much as operational subjects to be controlled. In this regard, however, the present invention is founded on the first discovery that the change of resistivity of a crucible made of graphite etc. reflects the change in the starting material temperature and the second discovery that the change of the resistivity of a crucible can be easily grasped by the change in the DC equivalent resistivity calculated from the DC current and DC voltage output from the converter, which had not been utilized much at all up to now. That is, although this DC equivalent resistivity is a value reflecting the sublimation temperature of the starting material in the crucible, this value had not been detected in the past. Therefore, by using this value as a control indicator for the growth conditions, it is possible to control the crystal production more precisely than the past.

The above such DC equivalent resistivity takes different values depending on not only the structure of the crucible and material thereof, but also the operating conditions of the induction heating furnace, elapsed time of the growth process, etc. For this reason, in order to make this DC equivalent resistivity a more effective indicator of the operational control, first, by changing the DC voltage value and DC current value of the converter in the high frequency power supply of the induction heating furnace while leaving the structure and material of the crucible and insulating material and the specifications of the induction heating furnace unchanged, it is possible to investigate the correspondence between the DC equivalent resistivity at the time of growth of an SiC single crystal and the elapsed time in the growth process (below, also referred to as the "variations in the DC equivalent resistivity (or DCV/DCI) over time") and the relationship with the quality of the obtained SiC single crystal. Thereafter, using the relationship of the change in the DC equivalent resistivity over time and micropipe density investigated in advance, it is possible to obtain a grasp of the DC equivalent resistivity where a high quality SiC single crystal is obtained.

Specifically, it is possible to record the DC equivalent resistivity (DCV/DCI) calculated from the DC voltage value (DCV) and the DC current value (DCI) of the converter in the high frequency power supply when growing an SiC single crystal with a micropipe density of a predetermined value or less (below, referred to as "standard SiC crystal") with respect to the elapsed time of the growth process so as to obtain the correspondence between the DCV/DCI at the time of growth of the standard SiC crystal and the elapsed time in the growth process. In this way, the variations in the DC equivalent resistivity over time when the standard SiC crystal is grown are identified and the identified change over time is used to determine a reference value for converter control. Further, it is sufficient to adjust the DC voltage value (DCV) or DC current value (DCI) of the converter based on the reference value for converter control or adjust both while supplying a high frequency current through the induction coil to grow an SiC single crystal.

Here, one of the reasons why an SiC single crystal with a micropipe density of a predetermined value or less is used as a "high quality" SiC single crystal is that micropipes are typical defects in SiC single crystals and are widely used as indicators of crystal quality. In addition, micropipes start to form at points of contamination by different SiC polytypes and precipitation of second phases. These are considered to be caused mainly because the temperature conditions at the time of growth of an SiC single crystal deviate from the ideal values. For this reason, in order to obtain a high quality SiC single crystal, preferably the standard SiC single crystal has a micropipe density of $5/cm^2$ or less, more preferably a micropipe density of $1/cm^2$ or less. Note that the magnitude of the heat stress and behavior of crystal nucleation, etc. result in finer defects in the SiC single crystal such as dislocations and stacking faults. Therefore, it is difficult to directly ascertain the growth conditions relating to temperature from these defects.

In obtaining such a reference value for converter control, for example, it is sufficient to grow SiC single crystals by predetermined conventional patterns of operation such as a coil current pattern or power pattern or a pattern of seed temperature as represented by the temperature of the top part of the crucible or a pattern of constant temperature of the bottom part of the crucible.

It is also possible to directly apply the actual measured values of the variations in the DCV/DCI over time when satisfactory crystal growth was realized as the reference value for converter control for the manufacture of a silicon carbide single crystal. Alternatively, it is possible to determine a function approximating the actual measured values of the variations in the DCV/DCI over time when satisfactory crystal growth was realized (below, referred to as a "standard equation") and apply that standard equation as the reference value for converter control for the manufacturing of a silicon carbide single crystal.

Further, when there are several variation patterns in the DCV/DCI over time where satisfactory crystal growth was realized, it is also possible to obtain the reference values for converter control from one of the variation patterns in the DCV/DCI over time and control the DC equivalent resistivity (DCV/DCI) in the growth process using at least one of the reference values.

Further, when there are several variation patterns in the DCV/DCI over time where satisfactory crystal growth was realized, it is also possible to determine the reference value for converter control based on the correspondence between the elapsed times in the growth process and the average value of the DC equivalent resistivity at the elapsed times.

Further, it is possible to determine the target zone of the DC equivalent resistivity based on the DC equivalent resistivity in the case where satisfactory crystal growth could be realized and the DC equivalent resistivity in the case where satisfactory crystal growth could not be realized and use this target zone as the allowable range of the reference value for converter control.

That is, when manufacturing a standard SiC crystal based on the reference value for converter control, it is also possible to set an allowable range of the DC equivalent resistivity (DCV/DCI) in accordance with the elapsed time in the growth process and grow the SiC single crystal in that allowable range of resistivity. Further, it is also possible to monitor the DC equivalent resistivity in the actual operation for manufacturing the SiC single crystal and judge that a high quality crystal can be manufactured if the DC equivalent resistivity is within a predetermined control range.

For example, the above-mentioned target zone of the DC equivalent resistivity (DCV/DCI) may be set within ±0.5% of target value for converter control at the elapsed time (t) in the growth process to control the DC equivalent resistivity in the actual operation.

When the measured value of the DC equivalent resistivity becomes larger than the predetermined target zone, it means the sublimation temperature of the starting material is higher compared with the satisfactory crystal growth conditions, while when it becomes smaller than the predetermined target zone, it means the sublimation temperature of the starting material is lower compared with the satisfactory crystal growth conditions. In either case, it is expected that a high quality crystal cannot be manufactured even if continuing operation as is.

In the above way, when the DC equivalent resistivity deviates from the reference value for converter control and allowable range thereof (or target zone) in actual operation for manufacturing an SiC single crystal, discontinuation of operation of the induction heating furnace is one option. Due to this, it is possible to slash opportunity loss and electrical loss. Alternatively, if, as explained above, adjusting the DC voltage or DC current of the converter to change the coil output of the induction heating furnace (high frequency current or electric power) to correct the DC equivalent resistivity to within the allowable range thereof (or within the target zone) and continuing manufacture of SiC, it is possible to raise the probability that a high quality crystal will be manufactured.

Note that, the DC equivalent resistivity in actual operation may be monitored over the entire growth process from the start to end of growth (constantly monitored) to manufacture an SiC single crystal. For example, it is also possible to monitor the DC equivalent resistivity at a number of points in the growth process and refer to the target value of DC equivalent resistivity corresponding to those points of time in the growth process of the SiC single crystal.

Note that, with the above-mentioned method of changing the coil output of the induction heating furnace, adjusting the DC equivalent resistivity to adjust the starting material sublimation temperature in the crucible is relatively easy. However, there is the possibility that the temperature difference between the seed crystal and the starting material sublimation temperature will also end up simultaneously changing. In such a case, for example, it is also possible to change the coil output of the induction heating furnace and simultaneously change the relative position of the induction coil with respect to the crucible so as to correct them so that both of the DC equivalent resistivity and measured crucible temperature become within the reference values for converter control and their allowable ranges or within the target zones. Further, to maintain the temperature difference between the seed crystal temperature and the starting material sublimation temperature within a predetermined range, it is also possible to use the seed crystal temperature or the temperature difference of the seed crystal temperature and starting material sublimation temperature as one of the parameters for determining the reference value for converter control. With this method, it is possible to make not only the sublimation temperature of the starting material in the crucible but also the temperature difference of the seed crystal and starting material providing the driving force for crystal growth target values, so the success rate of crystal growth is remarkably improved.

Further, the DC equivalent resistivity may change depending on the positional relationship of the crucible and coil as well. For this reason, sometimes the larger the margin of adjustment of the coil position, the more the actual growth conditions for obtaining a high quality SiC single crystal end up deviating from a specified single reference value for converter control. In such a case, as explained above, it is possible to specify a plurality of reference values for converter control and control the DC equivalent resistivity (DCV/DCI) so as to comply with any of the plurality of reference values for converter control to manufacture an SiC single crystal.

EXAMPLES

Below, the present invention will be specifically explained based on working examples and a comparative example. Note that the content explained below is one example. The present invention is not limited to this content.

Manufacturing of Standard SiC Single Crystal FIG. 1 shows an apparatus for growing a single crystal by the modified Rayleigh method used for the manufacture of SiC single crystal ingots according to working examples of the present invention and a comparative example. The crystal was grown by making the sublimating starting material (starting material powder) 3 sublimate by induction heating and making it recrystallize on the seed crystal 1. The seed crystal 1 was attached to the inside surface of the crucible lid 6 of the graphite crucible, while the sublimating starting material 3 was filled in the inside of the crucible body 4 of the graphite crucible. These crucible body 4 and crucible lid 6 were covered by an insulating material 5 for thermal insulation and were placed on a graphite support platform 7 at the inside of a double quartz tube 8.

The inside of the quartz tube 8 was evacuated using a vacuum exhaust system and pressure control system 12 to less than $1.0 \times 10^{-4}$ Pa, then purity of 99.9999% or more high purity Ar gas was supplied through the piping 10 while being controlled by a mass flow controller 11. A vacuum exhaust system and pressure control system 12 were used to hold the pressure inside the quartz tube at 80 kPa while a high frequency current was supplied through a work coil (induction coil) 9 connected to a not shown high frequency power supply to raise the bottom part of the graphite crucible to the target temperature. Nitrogen gas ($N_2$) was also similarly supplied through the piping 10 while being controlled by the mass flow controller 11 to control the partial pressure of the nitrogen in the atmospheric gas to adjust the concentration of nitrogen taken into the SiC crystal. The crucible temperature was measured by providing diameter 2 to 15 mm light paths in the insulating material 5 at the top part of the crucible of the crucible lid 6 side and the bottom part of the crucible of the bottom side of the crucible body and using emission pyrometers 13a and 13b. Then, the temperature of the top part of the crucible was used as the seed crystal temperature and the temperature of the bottom part of the crucible was used as the starting material temperature. After that, the pressure inside the quartz tube was reduced to the growth pressure of 0.8 kPa to 3.9 kPa over about 15 minutes. This state was held for a predetermined time to grow the crystal.

Figure 2:
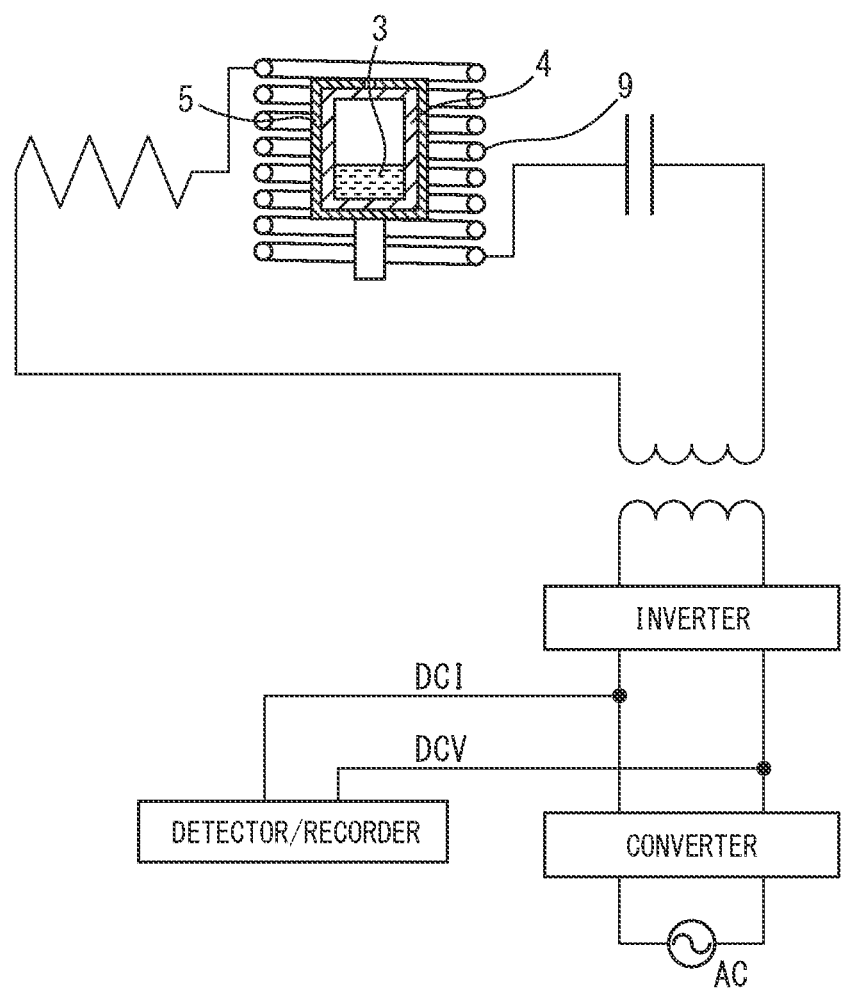
FIG. 2 is a schematic diagram showing the configuration of a power supply of an induction heating furnace used in the present invention.

Further, FIG. 2 shows an induction heating circuit of a high frequency power supply used for growing an SiC single crystal ingot according to the working examples of the present invention and the comparative example. This high frequency power supply was provided with a converter unit converting alternating current to direct current to control the output and an inverter unit converting the direct current output from the converter unit to a high frequency to obtain a high frequency current. It supplied the high frequency current to the work coil (induction coil) 9 surrounding the crucible having the crucible body 4 and crucible lid 6 to form an induction heating furnace. That is, the primary power source of this high frequency power supply was first adjusted in output power simultaneously with conversion to direct current by the converter (converter unit), then the inverter (inverter unit) converted the current and voltage output from the converter to the high frequency current with a frequency required in the resonance circuit including the induction coil. For the DC voltage and DC current, as shown in FIG. 2, it was possible to detect the values output from the converter and process and display them by a detector/recorder.

The growth apparatus shown in FIG. 1 and the high frequency power supply shown in FIG. 2 were used in a growth process setting a target temperature of the bottom part of the graphite crucible to 2400° C. to grow a single crystal a total of 20 times. The conditions for growing the single crystal will be explained. The crucible body 4 and crucible lid 6 used had sizes and structures for growing a 100 mm ingot. As the seed crystal 1, an SiC single crystal wafer comprised of the 4H single polytype having the (0001) face as a main surface, having a <0001> axis inclined in the <11-20> direction by 4°, and having a size of 101 mm was used. This seed crystal 1 had a micropipe density of 1/cm² or less. Further, as the starting material powder of the sublimating starting material 3, SiC having constant values of physical properties was placed in the crucible body 4. The growth pressure was 1.33 kPa, the partial pressure of the nitrogen gas was made from 180 Pa to 90 Pa and changed to maintain the electrical conductivity for the ingot as a whole, and crystal was grown for about 50 hours.

The SiC single crystal ingot obtained by the above method of crystal growth was ground by machine grinding, cut by a multi-wire saw, polished by diamond polishing, and otherwise worked by a known apparatus and technique to a thickness 0.4 mm mirror surface wafer having a (0001) face with an off angle of 4° the same as the seed crystal. The micropipes were counted by a Candela CS10 Optical Surface Analyzer. As a result, among the obtained 20 crystals (SiC single crystal ingots), 12 crystals with a micropipe density of $1/cm^2$ or less were obtained. The micropipe density of the 12 crystals was equivalent to the micropipe density of the seed crystal.

Figure 3A:
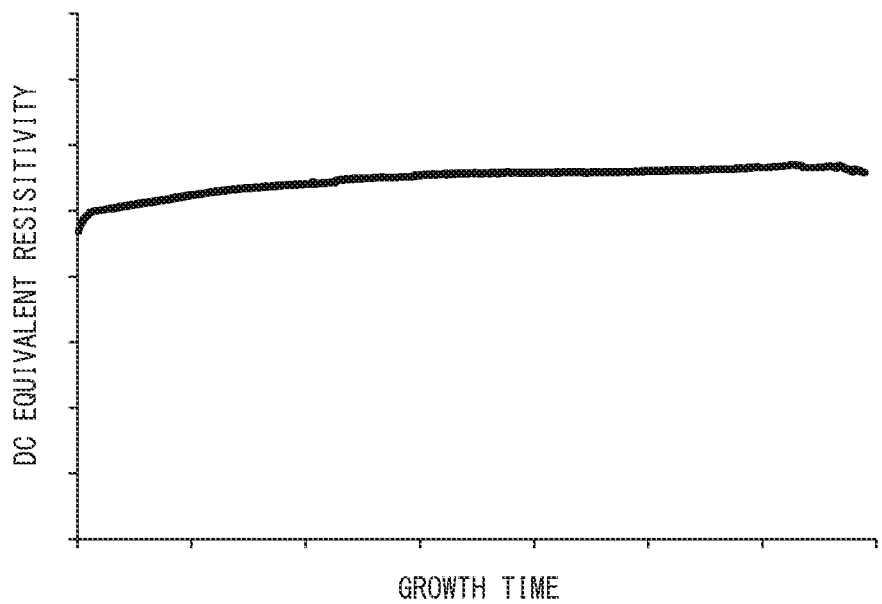
FIG. 3A is a graph of a DC equivalent resistivity used as a reference value for converter control determined based on actual measured values of variations in DCV/DCI over time obtained in the examples.
Figure 3C:
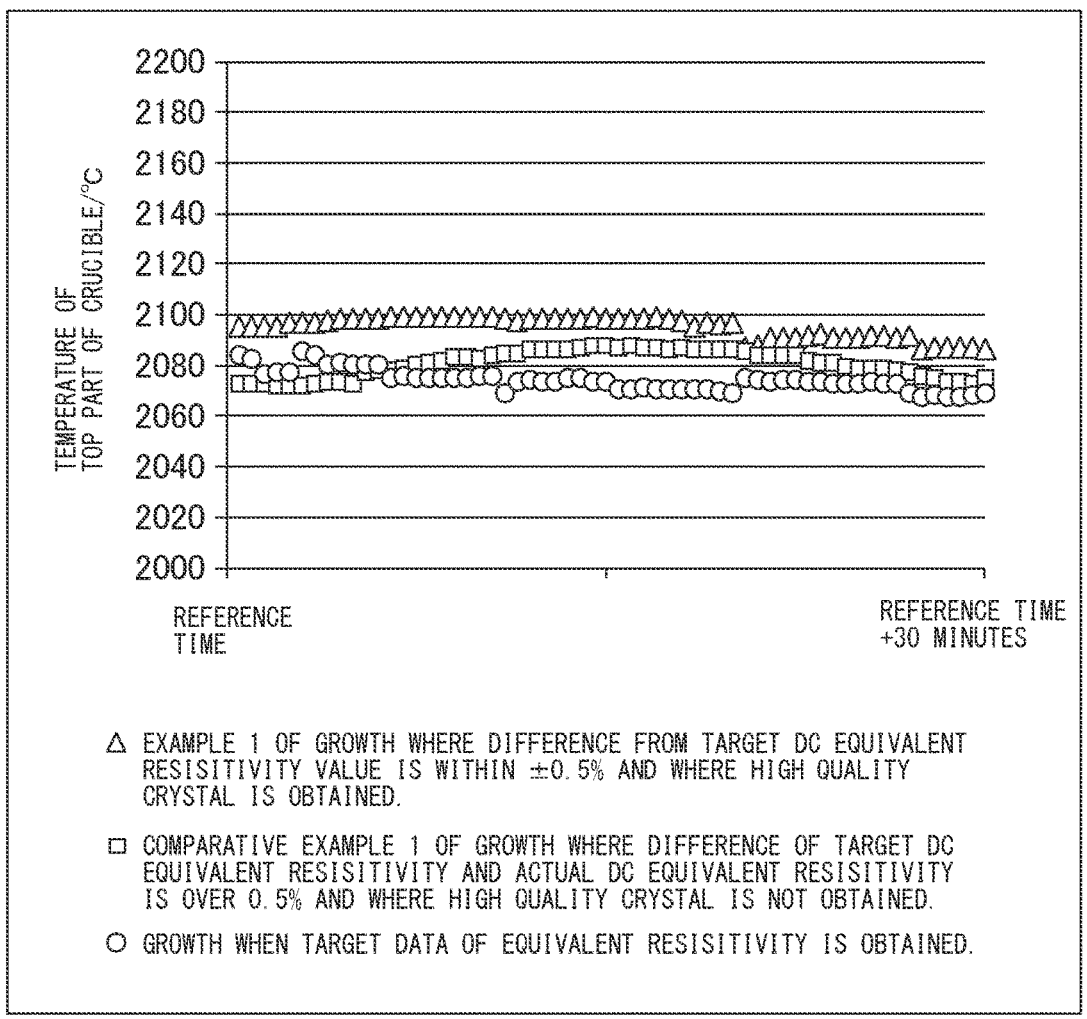
FIG. 3C A graph showing variations in a temperature of a top part of a crucible over time at the time of using a method for manufacturing a silicon carbide single crystal of an invention example and variations in a temperature of a top part of a crucible over time at the time of using a method for manufacturing a silicon carbide single crystal of a comparative example.

Even if using the same apparatus and same growth process in this way, a high quality SiC single crystal having an equivalent micropipe density to the seed crystal was obtained in a ratio of about 12/20 times. This is believed to be due to the unavoidable variation in the growth apparatus and growth process. Further, from one of the growth conditions applied for growing these high quality SiC single crystals, the relationship of the DC equivalent resistivity (DCV/DCI) calculated by the DC voltage value (DCV) and the DC current value (DCI) of the converter unit of the high frequency power supply and the elapsed time of the growth process (variations in DC equivalent resistivity over time) was selected. Based on the selected variations in the DC equivalent resistivity over time, the variations in DC equivalent resistivity over time were determined as the reference value for converter control. The variation over time used as a reference value is shown in FIG. 3A. Further, the variation in the temperature of the top part of the crucible over time at the time of the growth process of the SiC single crystal on the basis of the selected variations in the DC equivalent resistivity over time is shown in FIG. 3C.

Example 1

In Example 1, a growth apparatus and growth process used for growing a standard SiC single crystal were used to grow SiC single crystals for 20 times. At that time, the DC equivalent resistivity (DCV/DCI) found from the DC voltage value (DCV) and the DC current value (DCI) of the converter unit of the high frequency power supply was measured while adjusting the DC voltage value (DCV) and the DC current value (DCI) of the converter unit of the high frequency power supply targeting the variation in the DC equivalent resistivity over time shown in FIG. 3A.

That is, the operational control of the induction heating furnace used here was simple control with a single input (DC equivalent resistivity) and single output (coil output), so it was possible to use PID control by a commercially available program controller to adjust the DC voltage value (DCV) and/or the DC current value (DCI) of the converter unit to easily set the DC equivalent resistivity. When the actual DC equivalent resistivity became higher than the target DC equivalent resistivity by more than 0.5%, the output of the induction coil 9 was lowered, while conversely when it became lower than the target DC equivalent resistivity by more than 0.5%, the output of the induction coil 9 was raised during growth of an SiC single crystal.

Crystals were grown 20 times as explained above. The obtained SiC single crystals (ingots) were examined and the success rate in obtaining high quality crystals having a micropipe density of $1/cm^2$ or less and an equivalent quality to the seed crystal was calculated. As a result, as shown in Table 1, in Example 1 as a whole, out of 20 crystals, 15 were obtained with micropipe densities of $1/cm^2$ or less or a 75.0% success rate. Breaking this down, during crystal growth, the actual DC equivalent resistivity remained within a difference of ±0.5% from the target DC equivalent resistivity from the beginning to end and the induction coil 9 was not particularly adjusted in output (adjusted in operation) in nine cases. In each of these, crystals with a micropipe density of $1/cm^2$ or less were obtained (success rate 100%).

The actual measured value of the DC equivalent resistivity of one of the examples of crystal growth of the present invention where the DC equivalent resistivity was controlled to within ±0.5% of the target DC equivalent resistivity from beginning to end is shown in FIG. 3B. Further, the variation in the temperature of the top part of the crucible over time at the time of conducting the growth process of the same growth example is shown in FIG. 3C.

Further, during crystal growth, the actual DC equivalent resistivity exceeded ±0.5% in difference from the target DC equivalent resistivity and the coil output was adjusted in 11 cases. At that time, crystals with a micropipe density of $1/cm^2$ or less were obtained in six cases (success rate 54.5%). In this way, the success rate when adjusting the output of the induction coil 9 was 54.5% or a lower value than the overall success rate. This is believed due to the fact that the change of output caused a change in the temperature at the seed crystal side as well.

Comparative Example 1

On the other hand, in Comparative Example 1, instead of adjusting the DC voltage value (DCV) and DC current (DCI) of the converter unit of the high frequency power supply targeting the variation in the DC equivalent resistivity over time shown in FIG. 3A, adjusting the output of the induction coil 9, were used to grow an SiC single crystal 20 times in such a way as to reproduce the variation in the temperature of the top part of the crucible over time where the selected DC equivalent resistivity (that is, target value of equivalent resistivity) was obtained. An SiC single crystal ingot was grown under substantially same crystal growth conditions as those in Example, except the temperature adjusting method mentioned above.

In Comparative Example 1, even if the actual DC equivalent resistivity deviated from the target DC equivalent resistivity by over the allowable margin of ±0.5%, the DC voltage value (DCV) or DC current (DCI) of the converter unit was not adjusted. The output of the induction coil 9 was left constant in growing the SiC single crystal.

On the other hand, in Comparative Example 1, in the total 20 crystals, a high quality crystal having a equivalent quality to the seed crystal was obtained in 12 cases. The rate of success in growing a high quality crystal was therefore 60%. Breaking this down, growth with a difference from the target DC equivalent resistivity of within ±0.5% occurred 10 times and crystals with a micropipe density of $1/cm^2$ or less were obtained with a 90.0% high success rate. Further, growth with a difference of the target DC equivalent resistivity and the actual DC equivalent resistivity of over 0.5% occurred 10 times. In Comparative Example 1, the output of the induction coil 9 was not adjusted. A high quality crystal was obtained by a low success rate of 30.0%. That is, if comparing Example 1 and Comparative Example 1 for growth with a difference from the target DC equivalent resistivity of over ±0.5%, it can be said that by adjusting the coil output, the growth success rate rose from 30.0% to 54.5% and yield of crystal growth can be improved.

The actual measured value of the DC equivalent resistivity of one of the examples of crystal growth where the DC equivalent resistivity did not become within ±0.5% of the target DC equivalent resistivity and a high quality crystal could not be obtained is shown in FIG. 3B. Further, the variation in the temperature of the top part of the crucible over time at the time of the growth process of an SiC single crystal by the variation in this DC equivalent resistivity over time is shown in FIG. 3C.

TABLE 1

|  | Number of grown ingots | Number of ingots of micropipe density of 1/cm² or less | Ratio of ingots of micropipe density of 1/cm² or less |
|---|---|---|---|
| Example 1 as a whole | 20 | 15 | 75.0% |
| Growth where difference from target DC equivalent resistivity was within 0.5%, so operation not adjusted | 9 | 9 | 100.0% |
| Growth where difference from target DC equivalent resistivity was over 0.5%, so operation adjusted | 11 | 6 | 54.5% |
| Comparative Example 1 as a whole | 20 | 12 | 60.0% |
| Difference from target DC equivalent resistivity within 0.5% | 10 | 9 | 90.0% |
| Difference from target DC equivalent resistivity over 0.5% | 10 | 3 | 30.0% |

According to FIG. 3C, in each of the methods of manufacture of the working examples and the method for manufacture of the comparative example, a variation in the temperature of the top part of the crucible over time when the growth process of an SiC single crystal is performed, used for determining the variation over time of the target DC equivalent resistivity, was substantially realized. However, even if the actual heating temperature of the top part of the crucible was controlled to the target heating temperature, as shown by the data of the comparative example of FIG. 3B, the actual DC equivalent resistivity sometimes would not become a difference of within ±0.5% from the target DC equivalent resistivity. Further, in the comparative example where the DC equivalent resistivity was not controlled to become the target DC equivalent resistivity, as shown in Table 1, the ratio of a high quality SiC single crystal being able to be manufactured was lower compared with the working examples.

As mentioned above, it will be understood that controlling the difference from the target DC equivalent resistivity to within ±0.5%, compared with controlling the heating temperature of the temperature of the top part of the crucible to the target heating temperature, enabled more accurate detection of the thermal state of the starting material inside the crucible and enabled control of the growth conditions by the sublimation-recrystallization method. Further, from FIG. 3B, FIG. 3C, and the results of Table 1, it was shown that due to this function, the success rate and yield of crystal growth were raised.

Example 2

In Example 2 as well, a growth process with a fixed crucible structure and temperature conditions equivalent to Example 1 was used for manufacturing a single crystal 20 times. Further, as the target value of the DC equivalent resistivity, in the same way as in Example 1, the variation in the DCV/DCI over time shown in FIG. 3A was used to control the converter unit. However, in this Example 2, when the actual DC equivalent resistivity ended up deviating from the target DC equivalent resistivity, the output of the induction coil 9 was adjusted and simultaneously the relative position of the induction coil 9 with respect to the crucible was adjusted.

That is, when the DC equivalent resistivity became higher than the target value by over 0.5%, the coil output was lowered while the seed side temperature of the crucible was prevented from falling by making the coil position rise relative to the crucible. Conversely, when the DC equivalent resistivity became lower than the target value by over 0.5%, the coil output was made to rise while the seed side temperature was prevented from rising by making the coil descend relatively. In this Example 2, there were two inputs (DC equivalent resistance and seed crystal temperature) and two outputs (coil output and coil height). They differed in response speed and linearity, so the control became more complicated compared with Example 1. Therefore, PID control by a commercially available program controller was used to automatically control the coil output so that the DC equivalent resistivity became the targeted value while the temperature of the top part of the crucible, that is, the seed crystal temperature, was used as the basis to change the relative position of the coil by manual control while viewing the indicated value of the emission pyrometer 13*a*.

Further, in the same way as Example 1, the success rate in obtaining a high quality crystal having a quality equivalent to the seed crystal was calculated. The results are as shown in Table 2. That is, the actual DC equivalent resistivity was within ±0.5% in difference from the target DC equivalent resistivity and the operation was not adjusted (adjustment of output of coil and change of coil position) in 10 of the overall 20 times. A high quality crystal was obtained nine times (success rate 90%). Further, during the crystal growth, the actual DC equivalent resistivity exceeded ±0.5% in difference from the target DC equivalent resistivity, so the output of the coil was adjusted and the coil position was changed 10 times. A high quality crystal was obtained seven times (success rate 70%).

According to the previous Comparative Example 1, the expected value of the success rate of growth when not adjusting the conditions in growth with a difference from the DC equivalent resistivity of over 0.5% was 3/10=30.0%. Further, in Example 1, the success rate of growth after adjusting the output rose to 54.5%. Further, in Example 2, the coil output and the coil position were simultaneously adjusted to approach the ideal growth conditions. As a result, a 70.0% success rate was achieved. Overall as well, an 80.0% high growth success rate was realized.

According to the present invention, it is possible to obtain a relative grasp of the temperature of the starting material in the crucible (sublimation temperature), which had not been able to be detected in the past, by the DC equivalent resistivity. However, the DC equivalent resistivity may change depending also on the positional relationship of the crucible and coil, so the greater the adjustment range of the coil position, the more liable the actual measured value of the DC equivalent resistivity to deviate from the reference value for converter control. Therefore, a higher growth success rate can be expected by method of control of the coil position or output, correction of the target value of the DC equivalent resistivity when moving the coil, etc.

The method of Example 2 changes the coil output of the induction heating furnace and simultaneously changes the relative position of the induction coil with the crucible so as to correct both the DC equivalent resistivity and measured crucible temperature to within the ranges of the reference values for converter control and their allowable margins (or within the control ranges). The success rate of growth after adjustment of output (adjustment of operation) according to this Example 2 is higher than the success rate of growth after adjustment of output according to Example 1.

TABLE 2

|  | Number of grown ingots | Number of ingots of micropipe density of 1/cm² or less | Ratio of ingots of micropipe density of 1/cm² or less |
|---|---|---|---|
| Example 2 as a whole | 20 | 16 | 80.0% |
| Growth where difference from target DC equivalent resistivity was within 0.5%, so operation not adjusted | 10 | 9 | 90.0% |
| Growth where difference from target DC equivalent resistivity was over 0.5%, so operation was adjusted | 10 | 7 | 70.0% |

INDUSTRIAL APPLICABILITY

According to this invention, it is possible to more precisely detect the thermal state of the starting material in the crucible, which had been difficult in the past, and control the growth conditions in the sublimation-recrystallization method, so it is possible to improve the success rate and yield of crystal growth and, further, it is possible to improve the quality of the obtained SiC single crystal.

REFERENCE SIGNS LIST

1: seed crystal (SiC single crystal)
2: SiC single crystal ingot
3: sublimating starting material (SiC powder starting material)
4: graphite crucible
5: insulating material
6: crucible lid
7: graphite support platform (graphite support base and shaft)
8: double layer quartz tube
9: work coil
10: piping
11: mass flow controller
12: vacuum exhaust system and pressure control system
13a: emission pyrometer (for top part of crucible)
13b: emission pyrometer (for bottom part of crucible)

The invention claimed is:

1. A method for manufacturing a silicon carbide single crystal comprising surrounding a crucible holding a starting material powder and a seed crystal by an induction coil, supplying a high frequency current through the induction coil to heat the crucible, and making the starting material powder sublimate to grow a silicon carbide single crystal on the seed crystal, the method comprising: supplying the high frequency current through the induction coil by a converter for converting AC current to DC current and an inverter means for converting the DC current output from the converter to a high frequency current; determining, a relationship between variations in a DC equivalent resistivity (DCV/DCI) calculated from a DC voltage value (DCV) and DC current value (DCI) converted by the converter during crystal growth, and a density of micropipes formed in the grown silicon carbide single crystal; and controlling at least one of the DC voltage value (DCV) or DC current value (DCI) at the converter based on the relationship of the variations in the DC equivalent resistivity over time and the density of micropipe.

2. The method for manufacturing a silicon carbide single crystal according to claim 1, wherein the micropipe density in the relationship of the DC equivalent resistivity and micropipe density is equal to or less than a threshold value.

3. The method for manufacturing a silicon carbide single crystal according to claim 2, wherein the threshold value of the micropipe density is 5/cm² or less.

* * * * *